United States Patent [19]

Nelson et al.

[11] Patent Number: 4,708,281

[45] Date of Patent: Nov. 24, 1987

[54] APPARATUS AND METHOD FOR APPLYING SOLDER FLUX TO A PRINTED CIRCUIT BOARD

[75] Inventors: Leonard Nelson, Cherry Hill; Anthony J. Barresi, Hammonton, both of N.J.

[73] Assignee: RCA Corporation, Princeton, N.J.

[21] Appl. No.: 348,692

[22] Filed: Feb. 16, 1982

[51] Int. Cl.[4] .......................... H05K 3/34; B23K 1/20
[52] U.S. Cl. .................................. 228/180.1; 228/20; 228/37; 228/223; 118/63; 427/348
[58] Field of Search ................ 228/37, 20, 180.1, 223; 118/63; 427/348

[56] References Cited

U.S. PATENT DOCUMENTS 3,439,854  4/1969  Walker ................................... 228/37
3,500,536  3/1970  Goldschmied .................... 228/37 X

FOREIGN PATENT DOCUMENTS 120472  9/1980  Japan ..................................... 228/37

Primary Examiner—Kenneth J. Ramsey
Attorney, Agent, or Firm—Clement A. Berard, Jr.; Raymond E. Smiley; William Squire

[57] ABSTRACT

In a wave soldering apparatus including a station for forming a standing wave of foamed flux, a preheater station, and a standing wave of hot molten solder station, a flux removing apparatus for reducing the thickness of flux on a coated printed circuit board includes an apertured pipe for gently blowing a plurality of streams of air against the foam coated board, the streams acting effectively as a continuous linear stream of air. The airstreams also blow the foamed flux into apertures in the printed circuit board.

14 Claims, 11 Drawing Figures

APPARATUS AND METHOD FOR APPLYING SOLDER FLUX TO A PRINTED CIRCUIT BOARD

The U.S. Government has rights in this invention pursuant to Contract No. N00024-81-C-5106 awarded by the Department of the Navy.

The present invention relates to apparatus and processes for applying solder flux to a surface of a printed circuit board which is to be wave soldered.

Commercially available wave soldering apparatuses include a conveyor system for conveying a printed circuit board along a path through various work stations. The printed circuit board has components mounted thereon with leads extending through holes in the printed circuit board facing the underside of the board. The underside of the board has conductors adjacent the protruding leads to which the leads are to be soldered.

One type of wave soldering system includes a flux applying station at which liquid flux is formed into a standing wave of foamed flux. The printed circuit board in its travel along the path is conveyed through this standing wave of relatively thick and relatively viscous material having a consistency, somewhat similar to that of molasses. The foam coats the underside of the printed circuit board that comes in contact with the standing wave. However, the foam that is applied is excess and needs to be reduced in quantity. The conventional foam fluxing station includes a brush which is mounted downstream from the standing wave of foam so that it engages the coated surface of the printed circuit board. The brush wipes some of the foam away, reducing the thickness of the foam layer to a desirable value.

However, the technique just discussed introduces some problems. Components on the surface of the board opposite that being coated with foam are loosely mounted, their leads protruding through the printed circuit board. The brush wiping against the underside of the board sometimes pushes the leads of one or more of the components through the apertures of the board, causing these components to fall free.

The flux that is employed usually has a specific gravity of 0.85-0.87 which is passed through a foaming device to form the standing wave. Fluxes come in different degrees of reactiveness or activity. What this means is that different fluxes have different levels of acidity, that is, are of different cleaning power. The fluxes remove oxide coatings (and other impurities) on the printed circuit board conductors and on the surface of the leads within the board apertures.

While the most active flux is a better cleaner, it is not always possible to use such a flux as it is extremely difficult to completely remove and if some remains, it can, in time, corrode circuitry and component leads. For these reasons, a mildly activated rosin flux (RMA) is frequently used. However, an RMA flux is not as good a cleaner as the more active flux. This RMA flux therefore requires more careful application to the various printed circuit board surfaces to insure that the surfaces to be cleaned are completely coated by the flux. A preheater station over which the flux coated printed circuit board passes is located after the fluxing station. The preheater stage raises the temperature of the flux coated printed circuit board in a known way for known reasons. The coated printed circuit board is then passed through a standing wave of hot molten solder. The surfaces precoated with the flux, when passed through the solder wave, should become coated with a layer of solder which should adhere to the now clean surfaces. However, sometimes voids occur in the solder coatings on the various conductors and leads. The most prominent locations for the voids are within the apertures through which component leads pass. It was previously believed that bubbles of the foamed flux worked their way into small spaces such as those present between leads and printed circuit board aperture sidewalls and then burst, coating the sidewalls in the process. However, the present inventors believe that the bubbles of flux do not fully enter the apertures and therefore do not completely cover the sidewalls thereof or the portions of the leads inside the apertures. This inadequate coating, they believe, is what causes the voids and this was not known previously.

In accordance with the present invention the voids produced by the prior art system are alleviated by blowing on the foam after it has been coated on a surface of the printed circuit board. The blowing action tends not only to remove excess foam from the surface but also to blow the foam into the various apertures and around the leads in those apertures on the printed circuit board, thereby providing a more uniform coating on hard-to-reach surfaces such as those within these apertures and on the leads.

Figure 1:
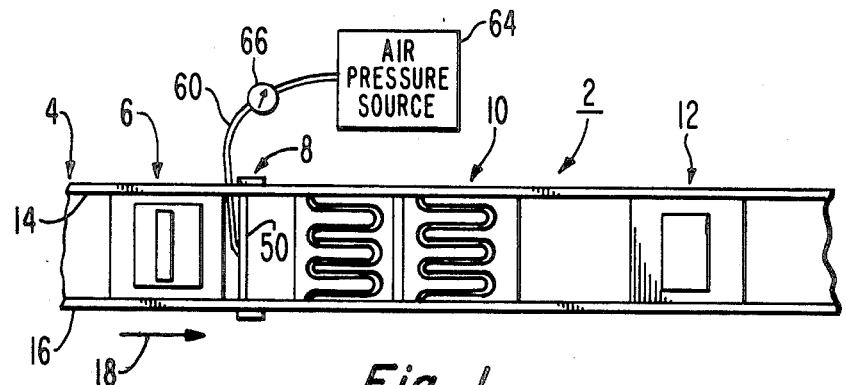
FIG. 1 is a plan view of a portion of a wave soldering apparatus according to one embodiment of the present invention.

In FIG. 1 wave soldering apparatus 2 includes a conveyor system 4, a foamed flux standing wave station 6, an apparatus 8 which includes features of the present invention, a preheat station 10, and solder wave apparatus 12 which forms a standing wave of hot molten solder. Except for the apparatus 8 the remaining portion of the apparatus 2 is conventional and commercially available. The apparatus 8 is an addition to that commercially available equipment.

Figure 2:
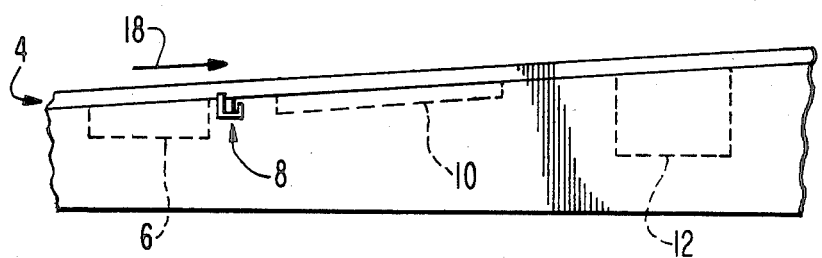
FIG. 2 is a side elevation of the apparatus of FIG. 1.
Figure 3:
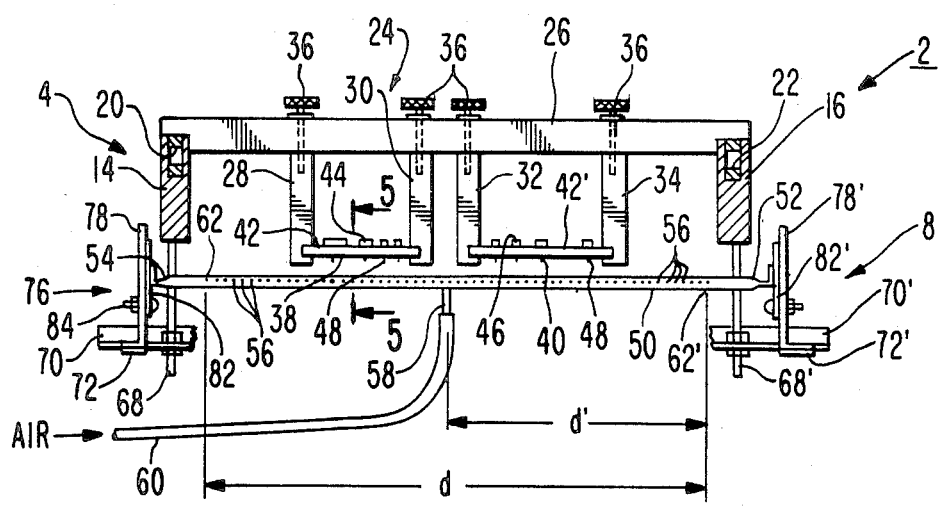
FIG. 3 is a sectional view through the apparatus of FIG. 1.

The conveyor system 4, FIG. 3, comprises a pair of rails 14 and 16 which include two conveyor chains 20 and 22, respectively, which move a printed circuit board in the direction indicated by arrow 18, FIGS. 1 and 2. The path of the board may be tilted slightly relative to the horizontal. One or more printed circuit boards to be processed by the apparatus 2 are placed on a printed circuit board carrier 24, FIG. 3, of known design, which rests on the two chains 20 and 22 of the respective rails 14 and 16. The printed circuit board or boards are suspended by the carrier 24 between the rails 14 and 16. In FIG. 3, two boards, side by side, are shown carried by carrier 24.

In FIG. 3 the rails 14 and 16 each are spaced apart and are parallel to one another, as shown. The conveyor chain 20 of rail 14, and chain 22 of rail 16, move in unison in the same direction 18 (FIGS. 1 and 2).

Printed circuit board carrier 24, FIG. 3, comprises several cross members 26, only one of which is shown, which rest on the chains 20 and 22. A plurality of parallel plates 28, 30, 32, and 34 are adjustably attached to the cross members 26. Plates 28–34 are secured in place by screws 36. Printed circuit board assemblies 38 and 40 are attached between the parallel plates 28, 30 and 32, 34, respectively. Printed circuit boards 38 and 40 may be the same or different in configuration and may have different components thereon. The components are placed on the upper side 42 of board 38 or 42' of board 40. The components 44, 46 have leads which pass through the apertures in the substrate of the printed circuit boards and face downward as shown at 48. While two boards 40, 42 are shown, more or fewer boards may be processed by carrier 24. Also, a board may be centrally positioned on carrier 24 rather than offset.

The rails 14 and 16 are secured to a supporting structure on a floor-mounted base. Only so much of the details of the wave soldering apparatus 2 are shown as is necessary to describe the present invention. It is to be understood that the wave soldering apparatus 2 may vary in design, shape, number of stations, and so on, from manufacturer to manufacturer. What is of concern in the present invention is that that flux foaming station 6 is included in the system.

In FIGS. 1 and 3 the apparatus 8 includes a long small diameter pipe 50 closed at opposite ends 52 and 54. The pipe 50 is formed with a plurality of equally spaced holes 56 between ends 52, 54. The holes 56 extend across the length of the pipe, distance d, FIG. 3, and lie on a straight line. The centrally positioned inlet 58 couples an air inlet hose 60 to the interior cavity of pipe 50. Inlet 58 is equidistant from the ends 62, 62' of the set of apertures 56. Hose 60, FIG. 1, is connected to a source 64 of pressurized air through a pressure adjustment and regulator device 66. Device 66 is employed to set the air pressure in hose 60 in a desired range, e.g., between 6–9 psi. It is to be understood that this pressure is for purpose of illustration and may vary somewhat depending upon the particular implementation.

Figure 4:
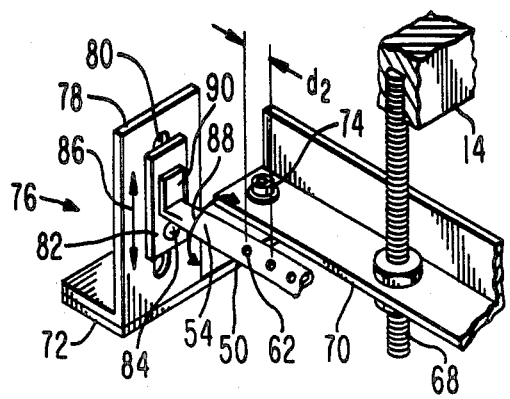
FIG. 4 is an isometric view of a portion of the apparatus shown in FIG. 3.

Pipe 50 is mounted to the respective rails 14 and 16. By way of example, pipe 50 and its mounting to rail 14 is shown in FIG. 4. A vertical stud 68 is secured to the rail 14 and depends therefrom. An angle iron 70 is secured to the stud 68. A bracket 72 is screwed to the angle iron 70 by screw 74. An L-shaped bracket 76 is secured to the bracket 72. Upstanding leg 78 of bracket 76 has a vertical slot 80. Plate 82 is bolted to the leg 78 by screw 84 through the slot 80. The plate 82 is vertically adjustable in directions 86 and is rotatable about the length axis of the pipe 50 in directions 88. Therefore, both the vertical and angular position of the plate 82 and thus pipe 50, as will be shown, can be adjustably set.

The pipe 50, FIG. 4, is squeezed at each end and formed into a flat metal flange 90 which is bent and welded to the plate 82. The other end 52 of the pipe 50 opposite end 54 is secured to the rail 16 with similar elements in mirror image fashion. Elements appearing at end 52 are primed to show similarity in construction, FIG. 3. As a result of the construction just described, the pipe 50 can be angularly and vertically positioned in any orientation in the direction of arrows 86, 88, FIG. 4.

Figure 5:
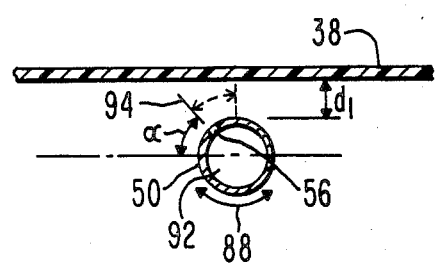
FIG. 5 is a sectional view of a portion of the apparatus of FIG. 3 taken along lines 5—5.

As shown in FIG. 5, air under pressure within the cavity 92 of pipe 50 is forced through the various apertures 56 in a stream 94. The holes 56 of pipe 50 all being aligned along a substantially straight line and all facing the same direction create, when pressurized air is applied to the cavity 50, a plurality of parallel airstreams 94. These airstreams have important parameters in accordance with the present invention as too much or too little air pressure, too large an opening formed by holes 56, or too small a hole 56, too many holes, that is, too closely spaced together, or too few holes spaced too far apart will result in a system that does not operate in an optimum way, as will be described.

Figure 6:
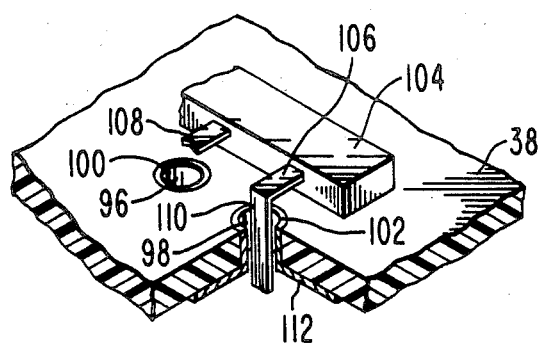
FIG. 6 is an isometric view of an integrated circuit package mounted on a printed circuit board prior to soldering.

In FIG. 6 printed circuit board 38, a portion of which is shown, has a plurality of apertures, two of which, 96 and 98, are shown. The apertures have metallized interior walls at 100 and 102, respectively. The printed circuit device 104 may have a plurality of leads (such as sixteen for example) two of which are shown at 106 and 108. All of the leads are identical in shape and extend from the device 104 in an L-shape so that a leg, such as leg 110 of lead 106, passes through its corresponding aperture such as aperture 98. Lead 108 is shown broken away for purposes of illustration. There may also be leads on the side of the device 104 opposite that shown in FIG. 6. For example, there may be four or more leads on each side of the device.

A problem in wave soldering the leads 106, 108 and so forth to the printed circuit board 38 conductors, such as conductor 112, FIG. 6, which may also be present on the board underside, and sidewall 102 in aperture 98, is that voids in the solder coating have been found to be present within the aperture 98 between the side wall 102 and lead 110. Such voids are undesirable as they can contain flux whose acid nature tends eventually to corrode the joint. Prior to the present invention the reason for the voids in the aperture 98 between leg 110 and side walls 102 was not completely understood. The present inventors believe, as mentioned in the introduction, that with the previous approaches insufficient flux was present in the space between the leg 110 and the side wall 102 to properly clean the leg 110 or side wall 102. This caused soldering of relatively poor quality and relatively poor adhesion of the solder material to the conductors. This is thought to be the source of the voids and is what permitted some of the flux to remain captured in the voids rather than being burned away as would be the case with a high quality, strongly adhering solder film.

Figure 8:
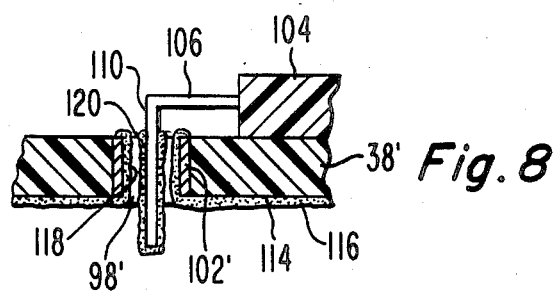
FIG. 8 is a sectional view through a printed circuit board and component after passing through the flux applicator of the system of the apparatus of FIG. 1.

Returning to the drawing, in FIG. 8, device 104 is shown mounted to the printed circuit board 38' after application of flux that has been foamed over the lower surface 114 of the printed circuit board. The printed circuit board has been processed past the apparatus 8, FIG. 1. The airstreams 94, FIG. 5, directed against the surface 114 have thinned the coating 116 of foamed flux on surface 114, and have removed the excess flux as the printed circuit board 38' was conveyed in direction 18, FIG. 1. However, more importantly, the foam has also been forced by the airstreams 94 into the aperture 98', FIG. 8, in the space between the leg 110 of lead 106 and the side wall 102' of the aperture 98'. Foam layer 116 on the surface 114 is shown to have flowed around and into the aperture 98' at 118. The foam 118 in the aperture 98' coats the side wall 102' substantially completely and there is an additional layer of foam 120 on the lead 106, leg 110 within the aperture 98'. As shown, the layer 120 of foam covers the leg 110 within the aperture 98' and that portion extending below the surface 114. The blowing action by the airstreams 94, FIG. 5, thus forces the foam into the spaces which it otherwise, without the presence of the airstream, might not reach. Thus, the airstreams serve the dual function of (1) removing excess foam by thinning the layer 116 to a desired thickness over the printed circuit board lower surface 114, and (2) forcing the foam into the apertures such as aperture 98'.

Figure 9:
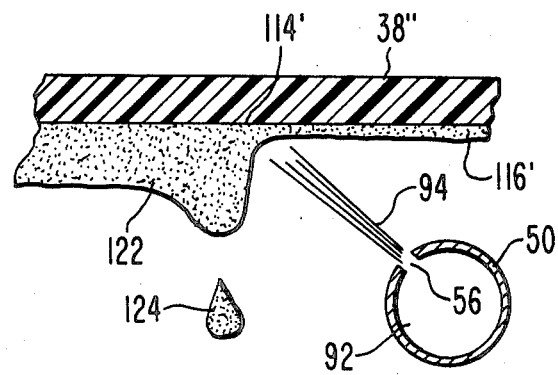
FIG. 9 is an end sectional view of a portion of the apparatus of FIG. 1 showing, in more detail, an embodiment of the present invention.

The thinning action, as shown in more detail in FIG. 9, is by streams 94 of air of sufficient velocity to dam-up the foam layer 122 so that it eventually builds up to a thickness sufficient to drop off the board. This is illustrated by the drop 124 pushed off the trailing edge of the board as it passes over the streams 94. The drops 124 or other excess flux is returned to the standing wave reservoir at the flux foam station 6, FIG. 1. As can be seen in FIG. 9, the relatively thin layer 116' of foam left remaining once the layer has passed the streams 94, is relatively uniform and is sufficiently thick to provide the desired cleaning action on the various conductors present on the printed circuit board 38".

Figure 7:
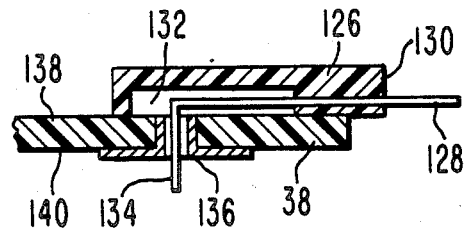
FIG. 7 is a sectional view through a printed circuit board and connector arrangement on a printed circuit board assembly to be soldered by the apparatus of FIG. 1.

In FIG. 7 is shown a different arrangement in which the apparatus of the present invention is particularly useful. Another portion of the printed circuit board 38 is shown in which a blind connector 126 includes an array of parallel connecting pins only one of which (128) is shown. The pins extend through the body 130 of the connector which is made out of thermoplastic material and into a cavity 132 formed by the connector body 130. The pin 128 is bent to form a leg 134. The leg 134 extends through an aperture 136 in the printed circuit board. The printed circuit board surface 138 is flat and the body 130 is flush against the surface 138 so as to seal the cavity 132, except for the apertures 136 in the printed circuit board. That is, there is no access to the aperture 136 except from the underside 140 of the printed circuit board 38. The apertures 136 are blind in the sense that one end, as represented by cavity 132, is sealed from the ambient as by body 130. Because the cavity 132 is sealed it tends to form a dead air pocket which tends to restrict the flow of foamed flux from the standing wave into the aperture 136. This type of aperture has been very difficult to solder in the past with the wave soldering apparatus employing a standing wave of foamed flux. Soldering in this way has resulted in a larger number of voids. It is believed that the foam cannot easily enter the aperture 136 because of the pocket of air in the dead air space which air cannot readily be driven from cavity 132 to make room for the foam. However, when using the present invention, the airstreams 94, FIG. 5, directed against the foam coating on the undersurface 140 of the printed circuit board 38, FIG. 7, tend to push the foam into the apertures 136, coating the leg 134, the aperture side walls and the leads present inside these printed circuit board apertures.

In practice, the arrangement of the pipe 50, its airstream forming apertures or holes 56 forming streams 94, FIG. 5, has been found to be relatively critical. In the present embodiment the pipe 50 was formed of ⅜ inch diameter metal pipe and the holes 56 were all of the same diameter 0.010 inch ±0.002 inch. The holes were spaced 0.250 inch apart. The upper surface of the pipe 50 was spaced a distance $d_1$ of about one inch, FIG. 5, from the lower surface of the printed circuit board 38. This distance is sufficient to allow component leads extending through the printed circuit board 38 to pass clear of the pipe 50 and it may vary somewhat from this dimension.

The distance $d_1$ is adjusted by adjusting the bracket assembly described above in connection with FIG. 4. The coarse adjustment for the distance $d_1$ is made by adjusting the vertical position of the bracket 70, FIG. 4. This is done by adjusting its position on the stud 68. The fine adjustment is made in directions 86 by vertically positioning the plate 82.

The holes 56 in the pipe 50, FIG. 5, are positioned at an angle $\alpha$ with respect to the horizontal, preferably of about 45°. This angle can vary in the range of 45°–90° depending on the implementation. The pipe is rotated in directions 88, FIG. 5, to set the angle $\alpha$. The inlet 58, FIG. 3, had an internal diameter of approximately 0.230 inch. The air pressure supplied is preferably in a range of 6–9 psi, as described above. The distance d, FIG. 3, is about 21 inches with approximately 84 holes 56. The inlet 58, FIG. 3, is centrally positioned on the pipe 50 so that there are an equal number of holes 56 on each side of the inlet to provide uniform distribution of the airstreams exiting the holes 56.

Figure 10:
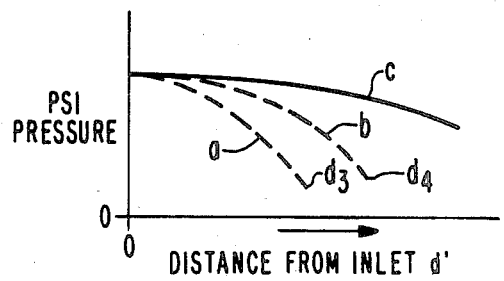
FIGS. 10 and 11 are graphs useful for explaining the present invention.

The size of the holes, the spacing of the holes, and the air pressure are all interrelated and are set at those values which together provide a continuous almost steady state airstream of almost uniform velocity for all of the holes 56. If the holes are too big, the pressure tends to drop off rapidly as a function of the distance of an air hole from the inlet 58. This is illustrated in FIG. 10 which is a chart of pressure vs. distance d' of an air hole from the inlet. If the holes are large, then a curve such as dashed curve a may result. At distance $d_3$ from the inlet, the pressure is quite low. If the holes are made slightly smaller a curve such as b may result. Here the distance $d_4$, at which the same low pressure is obtained is greater than $d_3$. The lower pressure at $d_3$ and $d_4$ is not desirable as it represents low stream 94 velocities. With the holes still smaller, as desired, the pressure curve is relatively flat for entire distance $d_1$.

If the number of holes is increased, that is, the spacing $d_2$, FIG. 4, is decreased, then the curves also tend to droop similarly to curves a and b. Curve a represents the greatest number of holes (smallest spacing) and curve c the fewest number.

The curve also can be made flatter, as at c, by reducing the number of holes. However, too few holes means larger spacing between holes and result in large individual stream velocities rather than an effective continuous stream of air extending across the path of the printed circuit board. For example, in FIG. 11 if the holes are too far apart then the airstreams might appear as at curve f. If the pressure for a maximum foam layer thickness were at p then it is seen that the curve f represents pressures which would be below the minimum desired level and the thickness of the foam would be greater than desired, the thickness being approximately inversely proportional to the velocity. The same kind of curve, such as curve f, would result by making the pressure too high, that is, the streams 94 of air pressure would have an extremely high velocity and would still produce pronounced high velocity streams of air which would result in non-uniform thickness of the foam flux.

Figure 11:
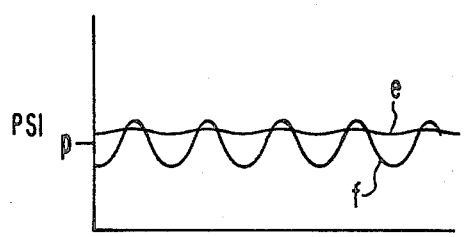

Curve e, FIG. 11, represents a more acceptable variation of pressure along a length of pipe 50 at points adjacent the printed circuit board surface being blown on by the streams 94. Here it is seen the variations in stream velocities manifested by pressure fluctuate mildly and are sufficiently uniform to provide a substantially uniform coating thickness as at 116', FIG. 9. In essence, the separate streams 94 act effectively as a continuous linear stream of air extending across distance d, FIG. 3, and curve e, FIG. 11 at the surface of the printed circuit board. Each peak of the curves f and e represents the point of concentration of the corresponding airstream from a hole 56 at the board surface 114' and each trough represents the minimum pressure at the board surface 114' at the midpoint between adjacent holes 56. Therefore, it is desirable to maintain the flattest possible curve, such as curve e, FIG. 11, and curve c, FIG. 10, from the centralmost holes 56 to those at the outer ends of the pipe 50 such as at 62 and 62'.

The hole size and spacing are provided such that curve e is as flat as possible. Thus, curve e appears to represent a single fan beam stream rather than separate discrete streams. Yet the streams 94 must be sufficiently great in velocity to blow away the excess flux while still leaving a relatively uniform thin film of foamed flux over the printed circuit board surface and in the various printed circuit board apertures.

The air pressure from the source 64, FIG. 1, if increased above 9 psi employing apertures of the dimensions described above, would blow too much flux from the printed circuit board surface. If the pressure is reduced to below 6 psi it is found that with the apertures dimensioned as described above that insufficient flux is removed. If the holes are made sufficiently larger than the dimensions shown above with the pressure range of 6-9 psi, it is found that the curve of pressure vs. distance from the inlet d' in pipe 50 appears closer to curves a or b of FIG. 10 than to the desired curve c. Also, making the hole spacing too great results in widely spaced and thus separate discrete streams as shown by curve f, FIG. 11, rather than an effectively single stream as shown by curve e. Some fluctuations in velocity amplitude in curve e are present but these fluctuations have negligible effect on the desired result.

It is to be understood, however, that the hole size, hole spacing, and air pressure are given for a given implementation depending on the foam employed, the printed circuit board aperture size and dimensions, and related factors. In one implementation the printed circuit board was conveyed in direction 18, FIG. 2, at 28 inches per minute when the pressure at source 64 was 7 psi and was increased to 40 inches per minute of travel when the pressure at source 64 was 9 psi employing a wave soldering apparatus manufactured by Hollis Engineering Company. Of course, as the rate of travel of the printed circuit board differs, its distance from the pipe, such as pipe 50, the orientation of the holes 56 from the pipe 50 also may differ from that shown and described and also the diameter and spacing of the holes 56 may differ from those dimensions given herein.

Typical holes employed on a printed circuit board, as shown in FIG. 6, having an aperture 98 diameter of 0.032 inch were used with a device 104 having leads 106 dimensioned 0.005×0.015 inch. Because of the close spacing of the holes 56 in pipe 50, most apertures in a printed circuit board randomly pass over or pass closely adjacent a stream or streams 94 so that flux is forced into that aperture without particularly aligning the holes 56 with the printed circuit board apertures. For example, a typical printed circuit board may have apertures spaced on 0.100 inch centers. Each apeture may pass adjacent a hole 56 within a fraction of an inch sufficiently small in value so that the adjacent stream 94 is effective for blowing flux into that aperture. Different hole sizes in the printed circuit board and different lead dimensions of components attached to the board may require variations in the process parameters. In any event, the airstreams developed by the air pressure in pipe 50 exiting through the apertures 56, FIG. 5, produces effectively a continuous stream over the distance d, FIG. 3, of substantially uniform pressure at the surface 114', FIG. 9, of the board curve c, FIG. 10, of minimum amplitude variation from hole to hole, curve e, FIG. 11. The airstreams represented by curves e and f represent stream velocities as they appear at the board surface 114', FIG. 9.

What is claimed is:

1. A printed circuit board foam fluxing apparatus comprising:
    means for passing an apertured printed circuit board through a standing wave of foamed flux to coat a surface of the board with the flux; and
    means for blowing a stream of air across said board against said coated surface, said stream having a relative position, velocity, orientation and shape such as to remove a portion of the flux on said coated surface and to leave on said surface a relatively thin film of the flux, and such as to blow a portion of said flux into the apertures in said board.

2. The apparatus of claim 1 wherein said means for blowing includes means for forming a plurality of equally spaced streams of air, the streams being sufficiently closed spaced and each being dimensioned and having a velocity such that together said streams form a relatively uniform stream of air extending across the width of the board, where these streams meet the foam at said surface of said board.

3. A method of fluxing an apertured printed circuit board comprising:
    passing the printed circuit board through a standing wave of foamed flux, and then;
    blowing away excess flux deposited on a surface of said passing board and blowing a portion of the flux into apertures in said board and around component leads which may be in said apertures in said board to form a relatively uniform coating of flux on said surface and in said apertures.

4. The method of claim 3 wherein said blowing step includes directing an effectively linear stream of air of substantially uniform pressure across said path against said flux deposited surface.

5. The method of claim 3 wherein said blowing step includes blowing a plurality of steams of air so as to simultaneously blow against said board surface in an effectively single stream across said surface.

6. In a wave soldering apparatus for soldering component leads to conductors on a printed circuit board, said leads being inserted in apertures in said board, said apparatus comprising conveying means for conveying said board along a given path, flux means for applying a foam flux coating to said board during said conveying, preheat means for heating said flux coated board, and wave solder means for applying hot molten solder to said heated flux coated board, the improvement therewith comprising:

blower means across said path between said flux means and said preheat means for blowing air against said coated surface prior to being heated, said blower means effectively providing a continuous airstream across said path of substantially uniform velocity, said airstream being of a velocity and orientation relative to said board to reduce the coating thickness over said board surface to a relatively thin, relatively uniform layer and to blow a portion of said foam into said apertures.

7. The apparatus of claim 6 wherein said blower means comprises conduit means transverse said given path for receiving pressurized air therein and a plurality of uniformly spaced apertures aimed toward said path.

8. The apparatus of claim 7 wherein the air is at a pressure of about 6-9 psi, said apertures being about 0.010 inch in diameter and spaced approximately ¼ inch apart across said path.

9. The apparatus of claim 6 wherein said blower means includes conduit means across said path for directing a plurality of separate equally spaced air streams aligned in a straight line at said path.

10. The apparatus of claim 9 wherein most of said airstreams are substantially uniform in velocity.

11. The apparatus of claim 9 wherein said blower means includes means for adjusting the angular position of said airstreams relative to the surface of the printed circuit board containing the coating of flux.

12. In a wave soldering apparatus including means for producing a standing wave of molten solder, carrier means for carrying an apertured substrate along a path through said wave, foam flux means for producing a standing wave of foamed flux in said path upstream from said solder wave, the improvement therewith comprising:
   means for directing a plurality of airstreams at and across said path, said means being located so that said airstreams cross the path between said flux wave and solder wave to form an effectively single airstream of substantially uniform velocity across said path, said airstreams for reducing the thickness of said foam on said substrate passed through said flux wave and for blowing flux into said apertures in said substrate.

13. The apparatus of claim 12 wherein said airstreams are equally spaced across said path.

14. The apparatus of claim 12 wherein said airstreams are of sufficient velocity and of sufficiently close spacing such that they effectively act as a single airstream which meets the substrate along a line normal to said path and which extends across substantially the width of the substrate.

* * * * *

Disclaimer 4,708,281—*Leonard Nelson*, Cherry Hill; *Anthony J. Barresi*, Hammonton, both of N.J. APPARATUS AND METHOD FOR APPLYING SOLDER FLUX TO A PRINTED CIRCUIT BOARD. Patent dated Nov. 24, 1987. Disclaimer filed May 20, 1991, by the assignee, General Electric Co.

Hereby enters this disclaimer to the remaining term of said patent.
[ *Official Gazette August 27, 1991* ]